United States Patent [19]

Feuerbaum

[11] 4,292,519
[45] Sep. 29, 1981

[54] DEVICE FOR CONTACT-FREE POTENTIAL MEASUREMENTS

[75] Inventor: Hans P. Feuerbaum, Munich, Fed. Rep. of Germany

[73] Assignee: Siemens Aktiengesellschaft, Berlin & Munich, Fed. Rep. of Germany

[21] Appl. No.: 98,645

[22] Filed: Nov. 29, 1979

[30] Foreign Application Priority Data

Jan. 23, 1979 [DE] Fed. Rep. of Germany ....... 2902495

[51] Int. Cl.³ ............................................. H01J 37/26
[52] U.S. Cl. .................................................... 250/310
[58] Field of Search ............... 250/310, 311, 305, 397, 250/396; 313/360, 363

[56] References Cited

U.S. PATENT DOCUMENTS 3,646,344 2/1972 Plows ................................. 250/310
3,896,308 7/1975 Venables et al. .................. 250/310

*Primary Examiner*—Bruce C. Anderson
*Attorney, Agent, or Firm*—Hill, Van Santen, Steadman, Chiara & Simpson

[57] ABSTRACT

The invention relates to a device for contact free potential measurements of integrated circuits by means of measuring the energy of the secondary electrons released at the measuring location. One collector electrode 16 and one opposing field electrode 18 are arranged in succession at a predetermined distance from the measuring point with the electrodes 16 and 18 being formed as grid electrodes and arranged parallel to the flat surface of the circuit being tested. The secondary electrons are intercepted by a scintillator where their energy can be measured and the device makes it possible to have contact free potential measurements on paths of integrated circuit wafers.

3 Claims, 1 Drawing Figure

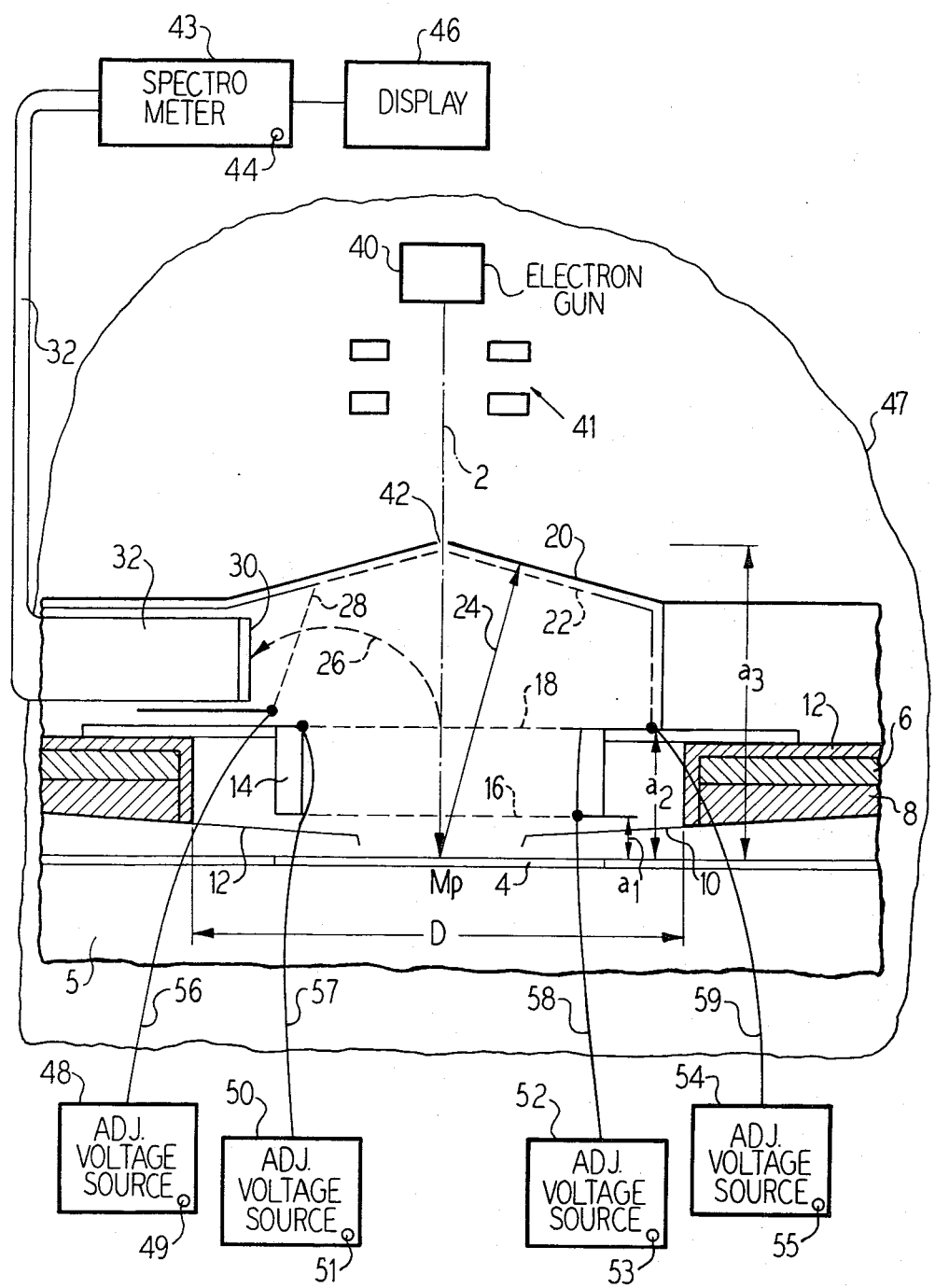

DEVICE FOR CONTACT-FREE POTENTIAL MEASUREMENTS

BACKGROUND OF THE INVENTION

1. Field of the Invention

The invention relates to a device for contact-free potential measurements using a primary electron beam which triggers secondary electrons at the measuring point of an electronic component, preferably an integrated circuit, and the energy of the released secondary electrons are determined with a spectrometer.

2. Description of the Prior Art

It is known for testing the function of electronic component parts as, for example, integrated circuits, to have contact-free potential measurements which are accomplished with an electron microscope, preferably a scanning electron microscope. The electron microscope essentially consists of an electron-optical column which contains an electron gun and is generally provided with a device for keying the electron beam and for deflecting the electron beam. These devices are arranged in a vacuum within the column. The component to be tested is mounted outside of the electron-optical column in a test chamber which is also maintained at vacuum and in which the electron collector of the spectrometer is situated.

At the measuring point the primary electron beam releases secondary electrons from a component and the secondary electrons are collected by an electron collector and are converted into electrical signals. The number of secondary electrons released by the primary electron beam at the measuring point depends on the potential at the measuring point. For a quantitative potential measurement, the electron microscope is provided with a spectrometer, for example, a retarding field spectrometer which contains a cylindrical deflection capacitor that supplies the secondary electrons to the electron collector through a retarding field and the electron collector converts the electrons into a corresponding electrical signal and drives a controlled-gain amplifier. The output signal of the amplifier drives the spectrometer by way of a feedback loop. The grid voltage at the opposing field electrode is adjusted until the voltage between the grid and the measuring point has again achieved its original constant value. Then the change of the grid voltage directly corresponds to the potential change at the measuring point of the test site.

It is known that a function test of integrated circuits is possible with the circuits being mounted on a wafer and before they are provided with electrical connections. In these known methods, a so-called wafer prober which is provided with needles can be used to test the function of the components in that the needles are applied to predetermined parts of the surface, so-called pads. The surface units have an edge length of, 10–50 μm. The measurement thus extends to parts of the component which are later provided with a terminal conductor mounted on the base. The electrical signals measured with these applied needles are supplied to a computer which monitors the function of the component ("Microanalytical Probing System" manufactured by POLYTEC).

SUMMARY OF THE INVENTION

The object of the present invention is to accomplish quantitative potential measurements for testing the function of semiconductor components on narrow pads within a circuit with the width of said tracks only comprising a few micrometers for example less than 4 μm. Such measurements can be accomplished with the primary electron beam of a scanning electron microscope. For this purpose, however, the spectrometer provided before the capture of the secondary electrons must be introduced into an appropriate bore of the wafer prober and must also be movable in this bore in the surface plane of the component. Also, local electrostatic fields exist at the surface of integrated circuits which fields drive the released low energy secondary electrons back to the circuits surface and, thus, measuring errors occur. A regulating circuit is generally employed for the signal processing of the secondary electron signals which regulating circuit generally only achieves required high band width when the spectrometer has an integral energy distribution. Also, the diameter of the primary electron beam essentially depends on the working distance which, thus, may be small only if the primary electron beam diameter is to be suitable for potential measurements on narrow paths. Also, the spectrometer must be usable for various wafer probers and also for the examination of individual mounted integrated circuits which are already provided with electrical connections, so-called bond wires.

The object of the invention is achieved in that an extraction electrode and retarding field electrode are arranged in succession at a predetermined distance from the measuring point with the electrodes being formed as grid electrodes and being arranged at least approximately parallel to the surface of the component. By arranging the extraction grid at a very small distance from the measuring location, one obtains a corresponding high field strength at the measuring point which prevents secondary electrons from being driven back to the surface of the components due to stray fields. The capture network thus replaces the standard Wehnelt electrode in conjunction with an anode. The retarding field electrode decelerates the secondary electrons which have been accelerated to high energy and drives the low energy components of these electrons back to the component. Thus, only the high energy electrons pass through the retarding field network grid.

These high energy electrons are siphoned off by an additional collector electrode which is arranged at the spectrometer in front of the scintillator. The second collector electrode attracts the secondary electrons to the scintillator and at the same time functions as a screen between the primary electron beam and the scintillator at which, in general, a relatively high voltage as, for example, 10 kV or more is present.

A preferred embodiment of a spectrometer arrangement consists in that a trap for backscattered electrons is provided. The fast electrons released at the measuring point with correspondingly high energy can trigger secondary electrons in other parts of the spectrometer, which secondary electrons can pass through the scintillator and cause errors in the measured results. The trap arranged a predetermined distance from the spectrometer parts is negatively charged relative to the housing of the spectrometer and thus holds back secondary electrons which are released at the housing. Thus, the secondary electrons cannot overcome the retarding fields of the catch trap. Thus, disruption of the measuring results due to these back-scattered electrons is suppressed.

The scintillator for the secondary electrons of the detector can preferably be rigidly connected to the spectrometer and is provided with a relatively thin fiber-optic light guide which conducts the photons triggered in the scintillator to the detector.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWING

The drawing comprises a detail cut-away sectional view of the scanning electron microscope according to the invention.

DESCRIPTION OF THE PREFERRED EMBODIMENTS

The FIGURE illustrates a primary electron beam 2 which is generated by an electron gun 40 in an electron-optical column which is well known and which is not illustrated in great detail in the FIGURE. The electron beam 2 passes through focusing and keying electrodes 41 and passes through an opening 42 in a cover member 20 and impinges upon an electron component 4 at a measuring point Mp. The electron component 4 can preferably be an integrated circuit and is arranged on the surface of a wafer 5 together with the components which are not illustrated in greater detail. The electron-optical column of the scanning electron microscope generally contains an electron gun 40 which essentially consists of a cathode and a modulator (or Wehnelt) electrode and an anode as well as a focusing unit for the primary electron beam 2 and a deflection unit which causes the electron beam to be positioned on the electronic component 4. The component 4 is mounted within a bore having a diameter D of, for example, 25 mm of a synthetic plate 6. A synthetic ring 8 in whose lower surface measuring points or probes 10 and 12 are embedded is mounted below the plate 6.

Within the bore spacers 14 are movably mounted on a guide 12 which is parallel to the upper flat surface of the component 4. A first grid electrode which serves as an extraction electrode 16 is mounted a small interval distance $a_1$ of, for example, less than 1 mm preferably less than 0.5 mm and extends essentially parallel to the surface of the component 4. On the other side of the spacer 14 a retarding field electrode 18 is mounted above the extraction electrode 16. Both of the electrodes 16 and 18 can be formed as grids so as to allow the electron beam and the secondary electrons emitted from the component 4 to pass therethrough. The space above the component 4 is closed off with a cover 20 which is insulated from the pole piece of the scanning electron microscope and which is formed with an opening 42 through which the electron beam passes.

A catch trap 22 is mounted parallel to the cover 20 on the inside of the bore. The catch trap 22 is mounted preferably a small distance as, for example, a few tenths of a millimeter from the cover 20. The catch trap 22 serves as an electron trap for back-scattered electrons which are triggered at the measuring point Mp and which overcome the retarding field electrode 18 as shown in the FIGURE by the arrow 24. The catch trap 22 can also preferably be mounted in front of other metallic parts of the chamber, for example, in front of the side walls which are not illustrated.

The secondary electrons 26 are deflected by a second collector electrode 28 which is formed as a grid so that the electrones can pass therethrough and the secondary electrons arrive at the scintillator 30 of a spectrometer of the electron microscope. As is well known the electrons which engage the scintillator are converted in the scintillator crystal into photons and the photons are passed by the fiber-optic light guide 32 to a photomultiplier 43.

Due to the arrangement of the first extraction electrode 16 in conjunction with the retarding field electrode 18 the overall height $a_3$ can be limited to a few millimeters, for example, not substantially greater than 7 mm.

Due to the small overall height of the spectrometer, having a correspondingly small working distance, it is possible to obtain good focusing of the electron beam 2 with a correspondingly small diameter.

Due to the small intervals $a_1$ of the grid of the extraction electrode 16 from the measuring point Mp a high field strength of preferably at least 5 kV/cm at the surface of the component 4 is obtained. This assures that low energy secondary electrons released at the measuring point Mp will be prevented from being driven back into the surface of the component 4 by means of electrostatic interference fields which would cause the energy distribution of the secondary electrons to be incorrectly indicated and thus result in measuring errors. Thus, the invention provides undisrupted energy-free distribution which is intercepted by the scintillator 30 after the retarding field electrode 18.

The regulating unit can be standard for processing the electrical signals of the spectrometer and can only achieve a high band width if the spectrometer supplies an integral energy distribution. This means that the energy of the secondary electrons fall within upper and lower energy levels. This is accomplished by using the retarding field electrode 18 in conjunction with the two extraction or attraction electrodes 16 and 28.

In the sample embodiment of the scanning electron microscope illustrated, the spectrometer is suited both for various wafer probers and for the inspection of individual mounted integrated circuits. The entire component can be scanned by the primary electron beam 2 for controlled implacement of the points 10 and 12. For positioning the primary electron beam 2, the desired surface area of the component 4 is brought into the middle of the spectrometer at a high magnification as, for example, 1000. Then the first extraction electrode 16 and the retarding field electrode 18 are adjusted relative to the optical axis of the scanning electron microscope such that the grids of these electrodes are not imaged with high magnification.

For voltage potential measurements, the secondary electrons released at the measuring point Mp are accelerated by the first extraction electrode 16 into the retarding field of electrode 18. The higher energy secondary electrons pass through the retarding field electrode 18 and are accelerated by the second collector electrode 28 to the scintillator 30. The second collector electrode 28 at the same time serves for screening the primary electron beam 2 from the scintillator 30 which may have a high voltage as, for example, 15 kV.

Back-scattered electrons having correspondingly high energy can trigger secondary electrons from metal parts as, for example, the cover 20, but these are repelled by the catch trap 22 and cannot overcome this retarding field.

It is also possible, if desired, that the voltages of the opposing field electrode 18 and the catch trap 22 can be changed such that only the back-scattered electrons of the metallic parts, for example, the cover 20 are captured by the detector of the spectrometer if it is desired to measure these.

In the FIGURE, a cover 47 is diagrammatically illustrated so as to allow vacuum to be maintained within the test chamber and the electron microscope. The spectrometer is illustrated with a display 46 and a control knob 44 to adjust the parameters of the spectrometer. A first voltage source 48 has an adjusting knob and is connected to the electrode 28 by a lead 56. A second voltage source 50 has an adjusting knob 51 and is connected by a lead 57 to the electrode 18. A third voltage source 52 has an adjusting knob 53 and is connected to the electrode 16 by lead 58. A fourth voltage source 54 has an adjusting knob 55 and is connected to the catch trap 22 by lead 59.

Although the invention has been described with respect to preferred embodiments, it is not to be so limited as changes and modifications may be made which are within the full intended scope as defined by the appended claims.

I claim as my invention:

1. A device for contact-free potential measurement with a primary electron beam which releases secondary electrons at the measuring location of an electronic component (4), preferably an integrated circuit, a scintillator for receiving said secondary electrons, with the energy of said secondary electrons being determined with a spectrometer comprising, a first extraction electrode (16) with a spacing ($a_1$) from the measuring location (MP) of the component, a retarding field electrode (18) with a spacing ($a_2$) from the measuring location (MP), said first extraction electrode (16) and said retarding field electrode (18) substantially parallel to the surface of said component (4), a second extraction electrode (28) mounted between said retarding field electrode (18) and said scintillator (30), and said second extraction electrode (28) mounted at an angle which is greater than 0° relative to said retarding field electrode (18), said primary electron beam (2) impinging substantially normal to the surface of said component (4), and said first and second extraction electrodes and said retarding field electrode formed as grids.

2. A device according to claim 1, including a cover member formed with an opening and mounted so that said primary electron beam passes therethrough before impinging on said component.

3. A device according to claim 1, including a catch trap electrode mounted adjacent to said cover member between said cover member and said component and said catch trap connected to a fourth voltage source.

* * * * *